(12) United States Patent
Kubo et al.

(10) Patent No.: US 8,469,493 B2
(45) Date of Patent: Jun. 25, 2013

(54) FLEXIBLE WIRING MEMBER, LIQUID DROPLET JETTING HEAD, AND METHOD FOR CONNECTING FLEXIBLE WIRING MEMBER AND DEVICE

(75) Inventors: Tomoyuki Kubo, Nagoya (JP); Hirofumi Kondo, Tajimi (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 1280 days.

(21) Appl. No.: 12/142,722

(22) Filed: Jun. 19, 2008

(65) Prior Publication Data
US 2008/0316255 A1 Dec. 25, 2008

(30) Foreign Application Priority Data
Jun. 19, 2007 (JP) .................................. 2007-161119

(51) Int. Cl.
*B41J 2/05* (2006.01)
(52) U.S. Cl.
USPC ............................................. 347/58; 347/59
(58) Field of Classification Search
USPC ...................................................... 347/58, 59
See application file for complete search history.

(56) References Cited

U.S. PATENT DOCUMENTS

| 7,294,952 | B2 | 11/2007 | Ito | |
| 2005/0062806 | A1* | 3/2005 | Terakura et al. | 347/72 |
| 2007/0063206 | A1* | 3/2007 | Maeda | 257/88 |

FOREIGN PATENT DOCUMENTS

| JP | 62152478 U | 9/1987 |
| JP | H06-112620 A | 4/1994 |
| JP | 2003309354 A | 10/2003 |
| JP | 2004303885 A | 10/2004 |
| JP | 2005322850 A | 11/2005 |
| JP | 2007-076327 A | 3/2007 |

OTHER PUBLICATIONS

Japan Patent Office, Notice of Reasons for Rejection for Japanese Patent Application No. 2007-161119 (counterpart to above-captioned patent application), mailed Nov. 16, 2011.

* cited by examiner

*Primary Examiner* — Matthew Luu
*Assistant Examiner* — Henok Legesse
(74) *Attorney, Agent, or Firm* — Baker Botts L.L.P.

(57) ABSTRACT

A flexible wiring member which connects a device and an external signal source has a plurality of wire members in which a plurality of wires are formed on one surface of a substrate, and a plurality of wire members is stacked to face the device. A plurality of bumps for connecting with the device are provided to the wires on a surface, of the wirings, facing the device. Bumps of one of the wire members overlapping with the other of the wire members face the device via the through hole formed in the other of the wire members. Accordingly, it is possible to realize high densification of wires in the flexible wiring while suppressing a rise in a cost.

1 Claim, 13 Drawing Sheets

FLEXIBLE WIRING MEMBER, LIQUID DROPLET JETTING HEAD, AND METHOD FOR CONNECTING FLEXIBLE WIRING MEMBER AND DEVICE

CROSS REFERENCE TO RELATED APPLICATION

The present application claims priority from Japanese Patent Application No. 2007-161119, filed on Jun. 19, 2007, the disclosure of which is incorporated herein by reference in its entirety.

BACKGROUND OF THE INVENTION

1. Field of the Invention

The present invention relates to a flexible wiring member which connects a device and an external signal source, a liquid droplet jetting apparatus in which the flexible wiring member is used, and a method of connecting the flexible wiring member and the device.

2. Description of the Related Art

In a liquid droplet jetting apparatus which jets liquid droplets from nozzles, a driving signal is input to an actuator having drive portions each corresponding to one of the nozzles, via a flexible wire. Accordingly, the drive signal selectively applies a jetting pressure to a liquid.

In the liquid droplet jetting apparatus, when the number of nozzles is increased and the nozzles are arranged highly densely, the drive portions are also arranged highly densely. Therefore, it is necessary to make fine a wiring pattern of the flexible wire to be connected to the drive portion, and to increase the number of wires in the flexible wire. Here, for avoiding an increase in a size of a flexible wiring member, it is necessary to make the wiring pattern highly dense. However, when a width of each wire becomes thin by making the wiring highly dense, an electrical resistance of each wire becomes high. Moreover, a manufacturing cost of the flexible wire rises up. Therefore, there have been limitations in making the wiring pattern fine.

For facilitating high densification of the wires in the wiring pattern, in Japanese Patent Application Laid-open No. 2004-303885 (FIGS. 1 3), a first wire layer is provided on a front surface of the flexible wire, and a second wire layer is provided on a rear surface of the flexible wire. Moreover, the second wire layer on the rear surface is exposed to a surface via an opening of a through hole in the flexible wire. Further, an element to be connected to the flexible wire is arranged on a front surface side. The element has two types of electrode portions of different heights. An electrode portion on a lower side is connected to the first wire layer and the other electrode portion on a higher side is connected to the second wire layer via the opening.

SUMMARY OF THE INVENTION

However, the flexible wiring member described in Japanese Patent Application Laid-open No. 2004-303885 has a wiring pattern formed on its both surfaces. Such a flexible wire of a double-sided wiring type has a high cost as compared to a single-sided wiring type in which the wiring is made on only one surface.

The present invention has been made to solve the above-mentioned problems, and an object of the present invention is to realize a high densification of wires in a flexible wiring member while suppressing a rise in the cost.

According to a first aspect of the present invention, there is provided a flexible wiring member which is arranged to face a device, and which connects the device and an external signal source, including:

two wire members which are stacked mutually, and each of which have a belt-shaped substrate, a plurality of wires formed on one surface of the substrate, a plurality of electrodes connected to the wires respectively, and a plurality of bumps each projected from one of the electrodes toward the device, wherein a plurality of through holes is formed in one of the wire members stacked on a side of the device, and the bumps of the other of the wire members face the device through the through holes formed in the one of the wire members.

According to the first aspect of the present invention, the plurality of wire members are stacked, and bumps in the form of a protrusion for connecting with the device is provided to each of the (electroconductive) wires on a surface on a side of the device (electrical load) in each of the wire members. Moreover, the structure is such that one of the wire members is arranged on the other of the wire member which is arranged to face the device, and the bumps of the one of the wire members overlap with the device via the through hole formed in the other wire member. In other words, since the bumps to be connected to the device is formed to be distributed (divided) in the plurality of wire members, it is possible to decrease the number of bumps to be formed in each of the wire members. In other words, since it is possible to decrease the number of electroconductive wires to be wired in each of the wire members, it is possible to decrease a wire density in spite of the number of electroconductive wires necessary for driving the device. Therefore, it is also possible to increase a width of each of the wires. Consequently, even when the drive portions are provided densely to the device, since it is possible to decrease a wire density (density of wires) of each of the wire members by using wire members each having wirings only on a single side (single-sided wiring), it is possible to facilitate a reduction in a cost of components of the wire members.

Moreover, since the wire members are stacked to overlap with each other, it is possible to make small (reduce) an area in a plan view of the flexible wiring member as compared with the case in which the wire members are arranged side by side, and it also shows an effect of saving the space.

In the flexible wiring member of the present invention, the bumps of the other of the wire members facing the device via the one of the wire members may be formed to be projected, from a facing surface of the other of the wire members facing the device through the through holes formed in the one of the wire members; and height of the bumps of each of the two wire members may be adjusted such that a projection amount of a portion of the bumps projected through the through holes projecting from the facing surface is same as a projection amount, of a portion of the bumps provided on the one of the wire members projecting from the facing surface.

In this case, the height of the bumps is adjusted for each of the wire members such that the amount of protrusion of the bumps protruded, from the surface facing the device, via the through holes and the amount of protrusion of the bumps provided on one of the wire members nearest to the device, from the surface facing the device, become substantially the same. In other words, since a front end on a side of the device (toward the device) of all the bumps is formed to be in the same plane, it is possible to prevent a faulty connection (connection defect) at the time of connecting the bumps of the stacked wire members, to the device.

In the flexible wiring member of the present invention, the bumps provided on the two wire members respectively may be arranged to be distributed mutually.

In this case, the bumps provided to each of the wire members are arranged to be distributed (divided) mutually in a plan view from a direction of stacking. Therefore, even when the electroconductive wires for each of the wire members are arranged to be mixed in a plan view, and a wire pitch of each of the wire members can be rough, and it is possible to make dense a wiring pitch as a whole.

In the flexible wiring member of the present invention, the two wire members may be drawn in a same direction from the device; a circuit element may be mounted on an area, of each of the wire members, in which the wire members are drawn; and a signal from the external signal source may be inputted to the device via the circuit element.

In this case, since the wire members are drawn in the same direction from the device, the circuit element mounted in the area drawn of each of the wire member is positioned in the same direction with respect to the device. Therefore, it is possible to arrange a heat releasing body (heat sink) which is to be brought in contact with the circuit element for releasing heat of the circuit element at one place (location), or it is possible to arrange integrally such that the heat releasing body makes a contact with all the wire elements, thereby facilitating the saving of space.

In the flexible wiring member of the present invention, the one surface of the substrate, of each of the wire members, may be insulative, the wires and a covering material having an insulating property may be stacked on the one surface of the substrate; and each of the bumps may be formed at a portion of the substrate, at which a part of the substrate is removed such that one of the wires is exposed to the other surface of the substrate, or each of the bumps may be formed at another portion of the substrate, at which a part of the covering material is removed such that the wire is exposed to the one surface of the substrate.

In this case, the bumps may be formed at the sites at which the electroconductive wires are exposed to the other surface of the substrate, by partially removing the substrate. Alternately, the bumps may be formed at the sites at which the electroconductive wires are exposed to the one surface of the substrate, by partially removing the covering material. In other words, the bumps can be formed on a surface, of the one of the wire members, facing the device and being covered with the substrate, or the bumps can be formed on a surface, of the one of the wire members, facing the device and being covered with the covering material. In this way, it is possible to change the surface, of one of the wire members, on which the bumps are to be formed depending on the cases.

According to a second aspect of the present invention, there is provided a liquid droplet jetting head which jets droplets of different types of liquids, including:

a flexible wiring member which is arranged to face a device, and which connects the device and an external signal source, the flexible wiring member including two wire members which are stacked mutually and each of which has a belt-shaped substrate, a plurality of wires formed on one surface of the substrate, a plurality of electrodes connected to the wires respectively, a circuit element arranged on the substrate, and a plurality of bumps which are projected from the electrodes toward the device, one of the wire members stacked on a side of the device having a plurality of through holes formed in one of the wire members, and each of the bumps of the other of the wire members facing the device via one of the through holes formed in the one of the wire members;

a cavity section which is filled with the liquid, and in which a plurality of nozzle groups corresponding to the types of the liquids respectively are formed, each of the nozzle groups having a plurality of nozzles; and an actuator serving as the device and including a plurality of driving sections which correspond to the nozzles respectively and which apply selectively a jetting pressure to the liquids, respectively, in the cavity section, wherein the circuit element is mounted on each of the wire members of the flexible wiring member, and a signal from the external signal source is divided into a plurality of driving signals each traveling one of the wire members and each of the driving signals is inputted to the driving sections via one of the circuit elements; and a part of the driving signals traveled through the circuit element of each of the two wire members is distributed and inputted to a part, of the driving sections, corresponding to the nozzles in different nozzle groups.

According to the second aspect of the present invention, an arrangement is made such that a plurality of driving signals via the same circuit element are inputted upon being distributed (divided in) to the driving sections corresponding to the nozzles in different nozzle groups. In other words, not only one circuit element but a plurality of circuit elements correspond to one of the nozzle groups. Since each of the circuit elements has a slight variation in characteristics, when one circuit element is connected such that the circuit element corresponds to a certain nozzle group, there occurs to be a variation in characteristics of the nozzle groups due to the variation in characteristics of the circuit elements. Therefore, it is possible to suppress the variation in characteristics among the nozzle groups by making the arrangement as described above, and distributing the variation in the circuit elements to all the nozzle groups.

According to a third aspect of the present invention, there is provided a flexible wiring member which is connectable to a device having a plurality of bumps of different heights, including:

two wire members which are stacked mutually and each of which has a belt-shaped substrate, a plurality of wires formed on one surface of the substrate; and a plurality of electrodes connected to the wires respectively, wherein a plurality of through holes is formed in one of the wire members stacked on a side of the device, and each of the electrodes of the other of the wire members is exposed to the device, via the one of the through holes formed in the one of the wire members.

According to the third aspect of the present invention, since the electrodes to be connected to the device are formed to be distributed to the plurality of wire members, it is possible to decrease the number of electrodes to be formed in each of the wire members. In other words, since it is possible to decrease the number of electroconductive wires to be wired in each of the wire members, with respect to the number of electroconductive wires required for driving the device, it is possible to decrease a wire density, and to make thick a wiring pitch. Consequently, even when the driving sections are provided densely to the device, it is possible to use a wire member having a single-sided wiring, and to decrease the wire density (wiring density) of each of the wire members. Therefore, it is possible to facilitate the reduction in the cost of components of the wire members.

The device to be connected to the flexible wiring of the third aspect of the present invention may have a plurality of first bumps which is connectable to the electrodes of the one of the wire members; and a plurality of second bumps which is connectable to the electrodes of the other of the wire members and having a height greater than that of the first bumps, wherein a difference in the height of the first bumps and the height of the second bumps may be equivalent to a thickness of the one of the wire members. In this case, since a front end toward the flexible wiring of the first bump and the second bump are formed to be in the same plane, it is possible to prevent a faulty connection (connection defect) at the time of connecting the bump of the wire members stacked, to the device.

According to a fourth aspect of the present invention, there is provided a method for connecting a flexible wiring member and a device, including:

preparing a first flexible wiring member and a second flexible wiring member, each of which has a belt-shaped substrate and a plurality of wires formed on one surface of the substrate;

forming a plurality of electrodes on the wires of each of the first flexible wiring member and the second flexible wiring member;

forming a plurality of through holes in the first flexible wiring member;

positioning and stacking the first flexible wiring and the second flexible wiring with each other such that areas, of the first flexible wiring, in which the through holes are formed face areas, of the second flexible wiring member, at which the electrodes are to be formed;

forming bumps on the electrodes of each of the first flexible wiring and the second flexible wiring;

exposing the bumps of the second flexible wire via the through holes; and connecting the bumps, formed on the first flexible wiring and the second flexible wiring, to the device.

According to the fourth aspect of the present invention, since the bumps to be connected to the device are formed to be distributed to the plurality of flexible wire members; it is possible to decrease the number of bumps to be formed in each of the wire members. In other words, since it is possible to decrease the number of electroconductive wires to be wired in each of the wire members, with respect to the number of electroconductive wires required for driving the device, it is possible to decrease a wire density, and to make thick a wiring pitch. Moreover, the through holes are formed in one of the wire members, and positioning is carried out such that the through holes and the electrodes of the other wire member are facing mutually. Therefore, it is possible to expose the electrodes of the other wire member through the through holes. Therefore, it possible to expose, from the same side of the wire members, the bumps formed on the electrodes of the two flexible wire members, and wiring with the device becomes easy.

In the method of the present invention, the one surface of the substrate of each of the first flexible wiring member and the second flexible wiring member may have an insulating property; and each of the first flexible wiring member and the second flexible wiring member may have a covering material having an insulating property, and the wires and the covering material may be stacked on the one surface of the substrate of each of the first flexible wiring member and the second flexible wiring member; and the electrodes may be formed to be exposed on the other surface of the substrate by removing a part of the substrate, or to be exposed on the one surface of the substrate by removing a part of the covering material. In this case, in each of the cases namely a case in which the surface facing the device is the one surface of the substrate, and a case in which the surface facing the device is the other surface of the substrate, it is possible to change the surface on which the bumps are to be formed according to the case.

In the method of the present invention, after the first flexible wiring member and the second flexible wiring member may be positioned and stacked with each other, the through holes are formed in the first flexible wiring member, and the electrodes of the second flexible wiring member are formed. In this case, it is possible to expose the electrode of the second flexible wiring from the through hole by removing a part of the covering material or the substrate of the second flexible wiring simultaneously with forming the through hole in the first flexible wiring. Therefore, it is possible to simplify the process, and connections of the wires become easy.

DETAILED DESCRIPTION OF THE PREFERRED EMBODIMENTS

Figure 1:
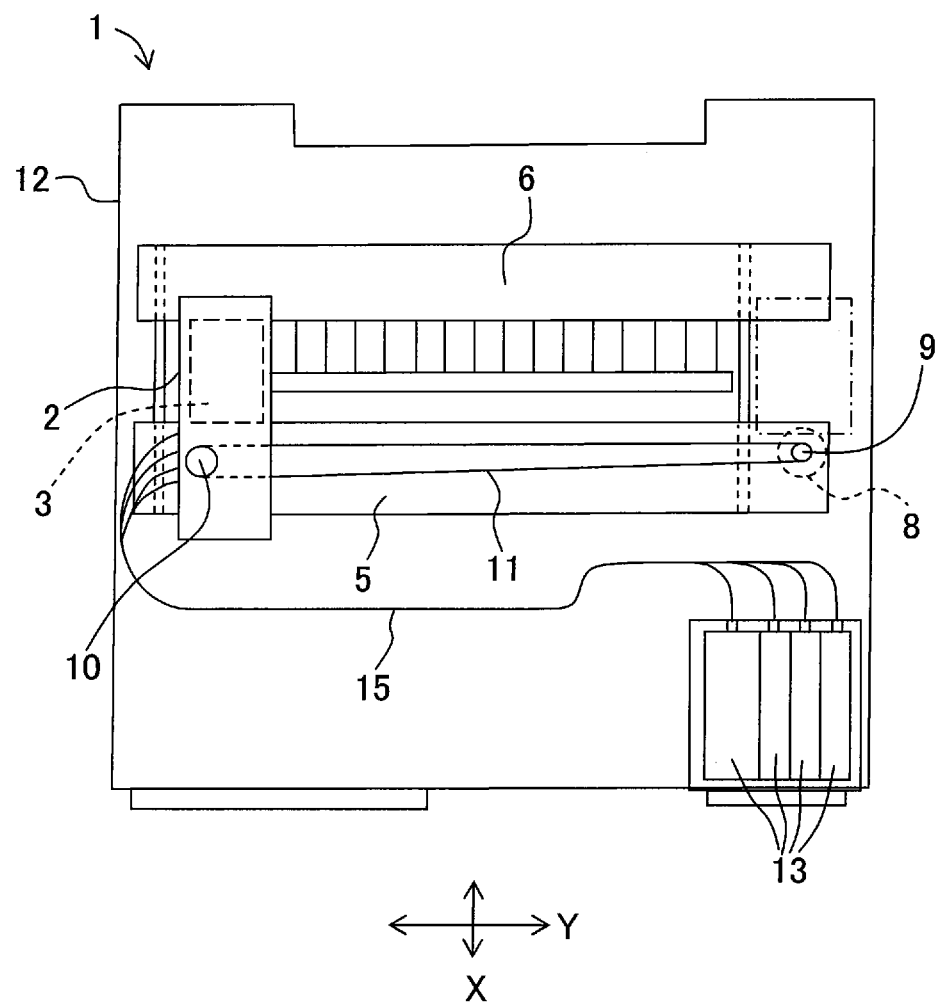
FIG. 1 is a schematic plan view of a recording apparatus to which, a liquid droplet jetting head of the present invention is applied.

A first embodiment of the present invention will be described below with reference to the accompanying diagrams. FIG. 1 is a schematic plan view of an ink-jet printer (recording apparatus) 1 according to (as an embodiment of) a liquid jetting apparatus of the present invention. The ink-jet printer 1 jets an ink from nozzles. The ink-jet printer 1 may be applied to an independent printer apparatus. Or the ink-jet printer 1 may be applied to a printer mechanism (recording section) of a multi-function apparatus which is provided with a plurality of functions such as a facsimile function and a copy function. In the following description, a direction of jetting of the ink from the nozzles to a medium is defined as a downward direction and a direction opposite to the downward direction is defined as an upward direction.

As shown in FIG. 1, the recording apparatus (ink-jet printer) 1 includes a carriage 2. A jetting head (liquid jetting apparatus) 3 is mounted on the carriage 2. Nozzles 7 are formed in the jetting head 3 (refer to FIG. 4), and the nozzles 7 are exposed on a lower surface of the carriage 2. The carriage 2 is supported, on a first guide member 5 and a second guide member 6, movably in a main scanning direction (Y-axis direction). The carriage 2 reciprocates along the Y-axis direction by a timing belt 11 which is put around a driven pulley 10 and a drive pulley 9 coupled with (linked to) a carriage motor 8. A paper on which the ink is jetted is transported in a secondary scanning direction (X-axis direction) which is orthogonal to the main scanning direction (Y-axis direction), at a lower side of the carriage 2.

An ink cartridge 13 which is replaceable is arranged inside an apparatus body 12. Here, in accordance with the number of ink colors, four ink cartridges 13 for a black ink, a cyan ink, a magenta ink, and a yellow ink respectively, are provided. The ink in each ink cartridge 13 is supplied independently to the carriage 2 via a supply tube. An ink supply tube 15 made of a resin material having flexibility, is used as the supply tube.

Figure 2:
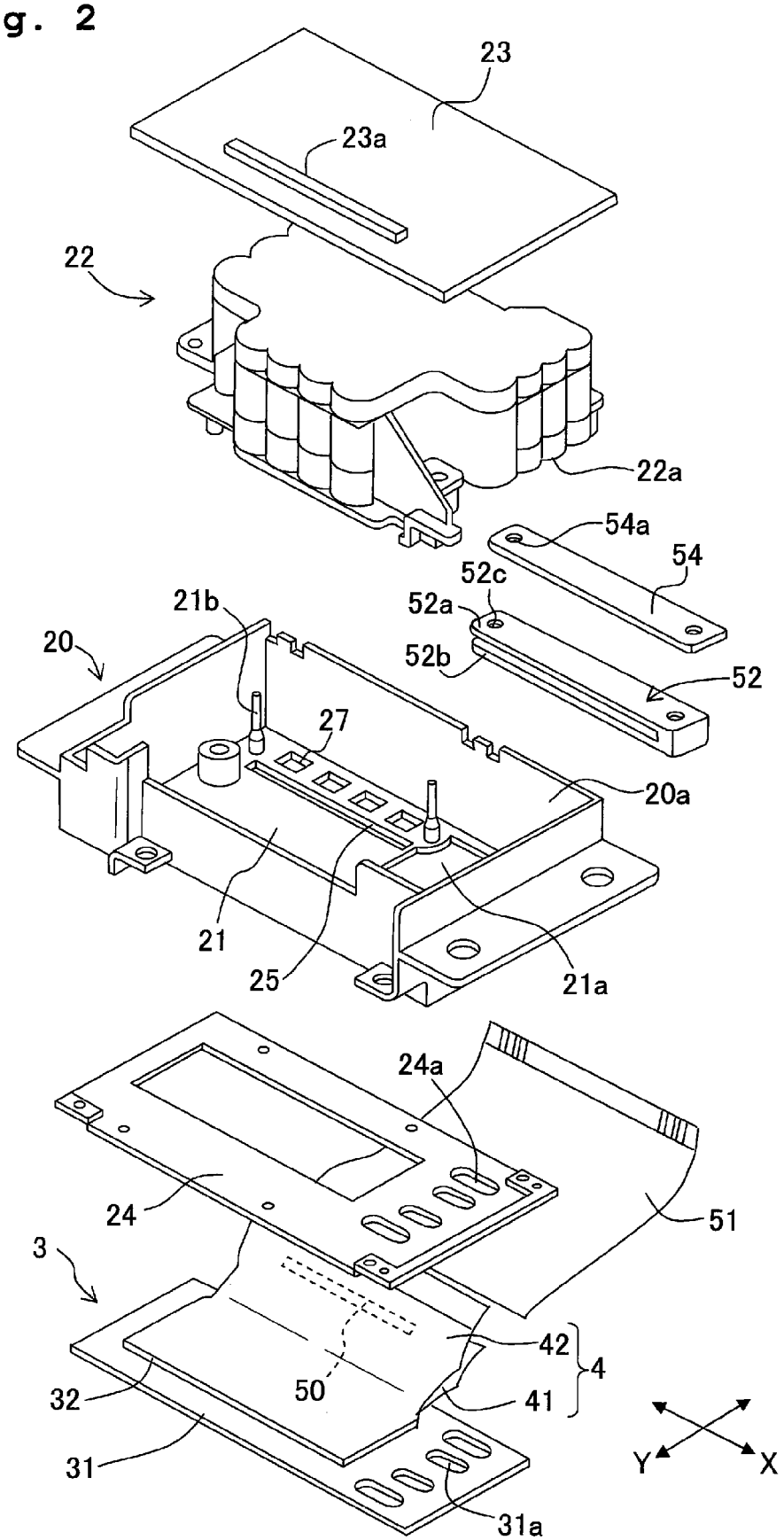
FIG. 2 is an exploded perspective view of a carriage.

As shown in FIG. 2, the carriage 2 includes a head holder 20 which is substantially box-shaped, having an opening on an upper surface. A reinforcing frame 24 is arranged on a lower surface side of a bottom plate 21 of the head holder 20, and further, the jetting head 3 is fixed to the reinforcing frame 24. In other words, the jetting head 3 is arranged on the bottom plate 21 of the head holder 20 via the reinforcing frame 24. A front frame 28 is stuck on a lower surface side of the reinforcing frame 24, such that the front frame 28 surrounds the jetting head 3 for modifying a step (unevenness) at a lower surface side of the head holder 20 (refer to FIG. 3).

An ink storage portion 22 which temporarily stores the ink which is supplied from the ink cartridge 13, and a circuit board 23 are mounted on an upper surface side of the bottom plate 21 of the head holder 20. The circuit board 23 receives a driving signal from a control unit (an external signal source) which is installed in the apparatus main body 12, via a flexible wire cable, and supplies a driving signal to an actuator 32 of the jetting head 3, via a flexible wiring 4.

In the first embodiment, the actuator 32 is connected to the circuit board 23 by the flexible wire member 4 and a flexible auxiliary wire 51 both of which are connected in an extension direction thereof. The flexible wiring 4 is connected to the actuator 32, and the auxiliary wire 51 is connected to a connector 23a of the circuit board 23 on which the circuit element 50 is mounted. Moreover, the flexible wiring 4 has a stacked structure in which two strip-shaped wire members, 41 and 42 (a first wire member 41 and a second wire member 42) overlap vertically (up and down). Each of the first wire member 41 and the second wire member 42 includes the circuit element 50, and is connected to the circuit board 23 via the auxiliary wire 51. A stacked structure of the first wire member 41 and the second wire member 42 will be described later.

For the flexible wiring 4 (the first wire member 41 and the second wire member 42), a chip on film (COF), in which it is possible to design a wiring pattern freely and on which the circuit element 50 is mounted, is used. For the auxiliary wire 51, a cable such as a general purpose flexible flat cable (FFC) and a flexible printed cable (FPC) in which conductive wires are wired in parallel is suitable. It is possible to reduce an amount of a high cost chip on film (COF) by using such general purpose auxiliary wire 51, and to reduce a component cost. As a matter of course, the auxiliary wire 51 may have a plurality of general purpose wire members connected mutually. Or the auxiliary wire member 51 may not be the general purpose wire member but a chip on film (COF).

A through hole is formed in the bottom plate 21 of the head holder 20, and at an inner side of an opening 21a of the through hole, an ink outflow port 22a of the ink storage portion 22, and an ink intake (inflow) port 31a of the jetting head 3 are connected via a connecting hole 24a of the reinforcing frame 24. Accordingly, ink is supplied independently for each color, from the ink storage portion 22 to the jetting head 3.

A slit hole 25, through which the flexible wiring 4 is passed is formed in the bottom plate 21, at a position toward one side wall 20a of the head holder 20. Moreover, a plurality of through holes 27 is formed in the bottom plate 21, along the two mutually facing side walls 20a. The through holes 27 are used for pouring an adhesive 26 for fixing the jetting head 3 on the lower surface side of the bottom plate 21. Moreover, two pins 21b for positioning and fixing a heat releasing body (heat sink, radiator plate) 52 are arranged on the bottom plate 21.

The circuit element 50 mounted on the flexible wiring 4 outputs a driving signal at a high frequency at the time of recording by the recording apparatus by jetting the ink from the nozzles. Therefore, the circuit element 50 generates heat along with outputting the driving signal. For releasing the heat, a heat releasing body 52 of a metallic material such as aluminum is provided in a close contact with the circuit element 50, at the inner side of the head holder 20. The circuit element 50 is mounted on each of the wire members 41 and 42. The heat releasing body 52 has an upper plate portion 52a and a lower plate portion 52b, and the upper plate portion 52a and the lower plate portion 52b are coupled in U-shape (refer to FIG. 2). Therefore, it is possible to make a contact with both the circuit elements 50. A pressing (pushing) member 54 is arranged on an upper side of the heat releasing body 52. Two holes 52c are formed in the heat releasing body 52 and two holes 54a are formed in the pressing member 54, each of the holes 52c, 54a being engaged with one of the pins 21b.

Figure 3:
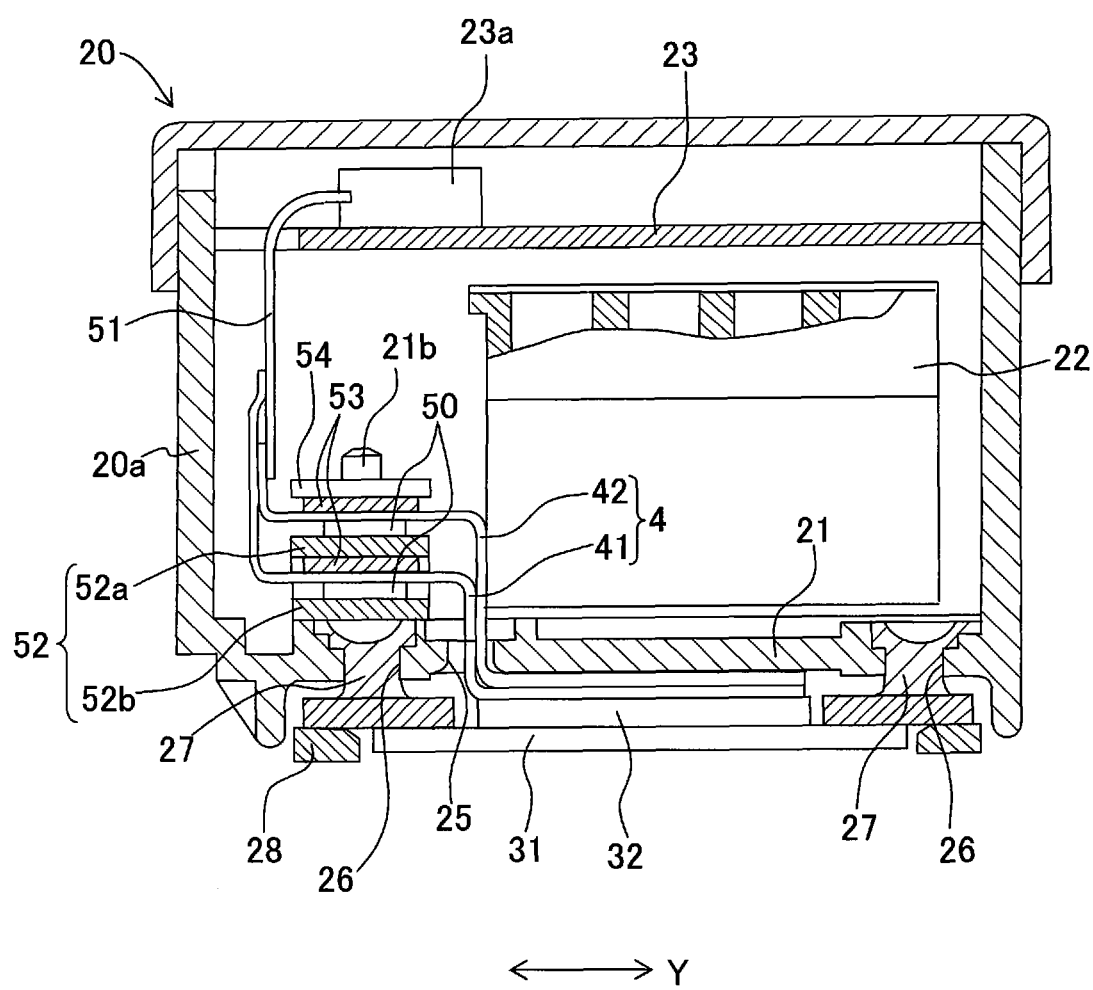
FIG. 3 is a vertical cross-sectional view in which, a head holder in a first embodiment is cut along a Y direction.

An upper surface of the upper plate portion 52a of the heat releasing body 52 is in a close contact with a lower surface of the circuit element 50 of the second wire member 42 (a surface, of the circuit element 50, not facing the second wire member 42), and an upper surface of the lower plate portion 52b is in a close contact with a lower surface of the circuit element 50 of the first wire member 41 (refer to FIG. 3). Further, the pressing member 54 is arranged such that the second wire member 42 is sandwiched from an upper side of the upper plate portion 52a. At this time, the pin 21b of the bottom plate 21 is inserted through a fixing hole 52c of the heat releasing body 52 and a fixing hole 54a of the pressing member 54, and is fixed by welding etc.

For bringing the circuit element 50 in a close contact with the heat releasing body 52, an elastic member 53 made of an elastic material such as rubber is fixed below a lower surface of the upper plate portion 52a of the heat releasing body 52, and below a lower surface of the pressing member 54. The circuit element 50 of each wire member is brought into contact by being pressed against the upper surface side of the lower plate portion 52b and the upper plate portion 52a by the elastic member 53. In other words, the circuit element 50 of the first wire member 41 makes a close thermo conductive contact with the lower plate portion 52b of the heat releasing body 52 by an elastic force of the elastic member 53. Moreover, the circuit element 50 of the second wire member 42 makes a close thermo conductive contact with the upper plate portion 52a of the heat releasing body 52 by a thrust of the pressing member 54 and the elastic force of the elastic member 53. A shape of the heat releasing body 52 is not restricted to such shape, and may be let to be substantially L shape in a cross-sectional view, which is extended continuously further upward from the upper plate portion 52a, thereby securing an amount of heat released.

Figure 4:
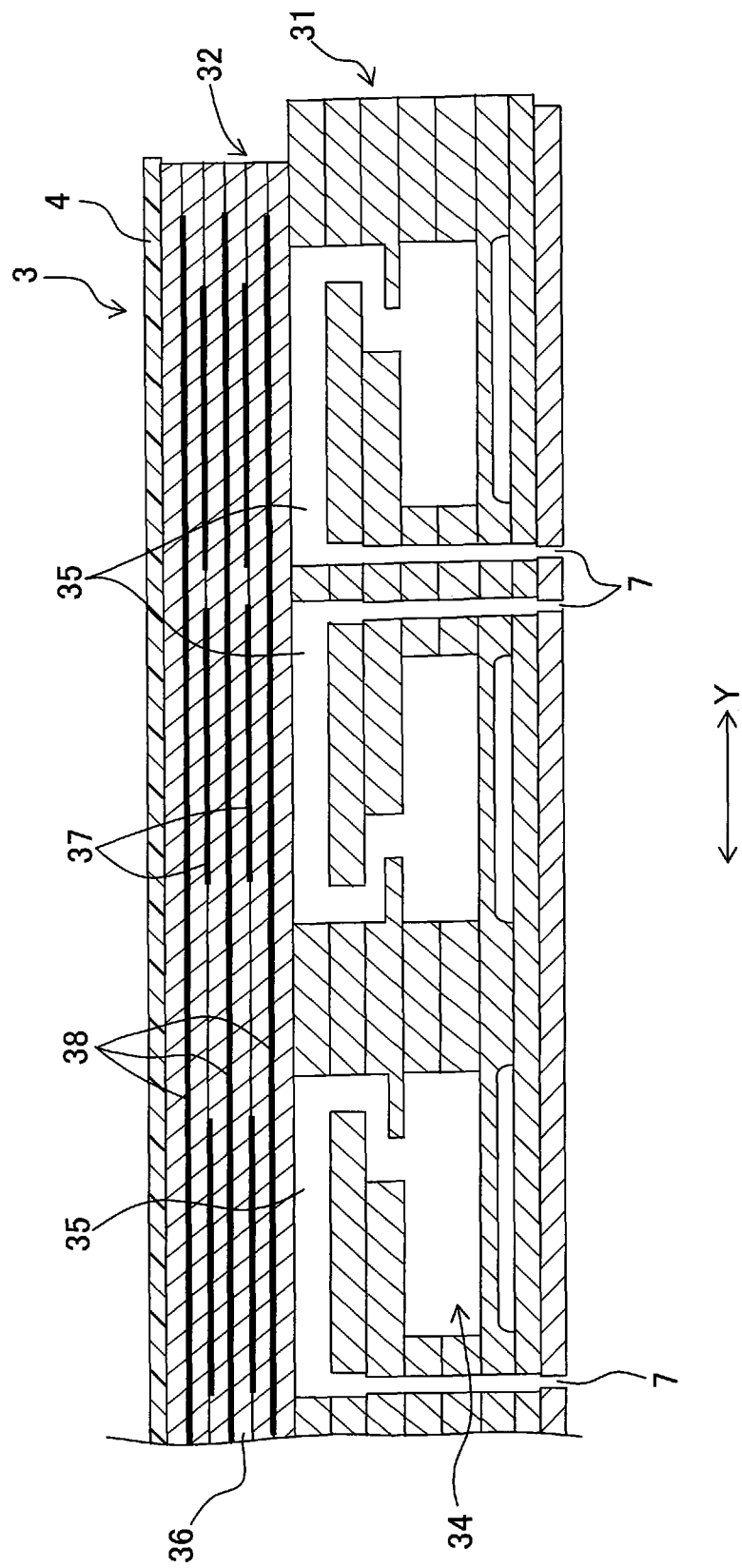
FIG. 4 is a vertical cross-sectional view in which a jetting head is cut along the Y direction.

The jetting head 3, similarly as hitherto known jetting head described in Japanese Patent Application Laid-open No. 2005-322850, has a cavity portion 31 on a lower surface of which the nozzles 7 are formed, and on an upper surface of which pressure chambers 35 are formed, an actuator 32 of a plate type, and the flexible wiring 4 as shown in FIG. 4. The cavity portion 31, the actuator 32, and the flexible wiring 4 are stacked (are in stacked form).

The cavity portion 31 has a stacked plurality of thin plates, including a nozzle plate arranged at a lowermost surface, and a cavity plate arranged at an uppermost surface. The plurality of nozzles 7 is formed in the nozzle plate, and a plurality of pressure chambers 35 communicating with the nozzles are formed in the cavity plate. At an interior of the cavity portion 31, an ink supply channel (passage) ranging from a manifold 34, distributed over the pressure chambers 35, and reaching the nozzle 7 is formed. Due to the ink supply channel, the ink introduced from the ink storage portion 22 into the ink intake port 31a of the cavity portion 31 fills the manifold 34 and the pressure chambers 35, and reaches up to the nozzles 7. The nozzles 7 and the pressure chambers 35 communicating with the nozzles 7 form a plurality of nozzle rows and a plurality of pressure chamber rows extended in an X direction in a plan view, respectively. These nozzle rows (pressure chamber rows), for each ink color, are arranged in a Y direction.

As shown in FIG. 4, the actuator 32 is a plate-shaped member having a size sufficient to cover all the pressure chambers 35. The actuator 32 has a plurality of plate-shaped ceramics layers 36 which are stacked, and a plurality of electrodes arranged between the ceramics layers 36.

Figure 5:
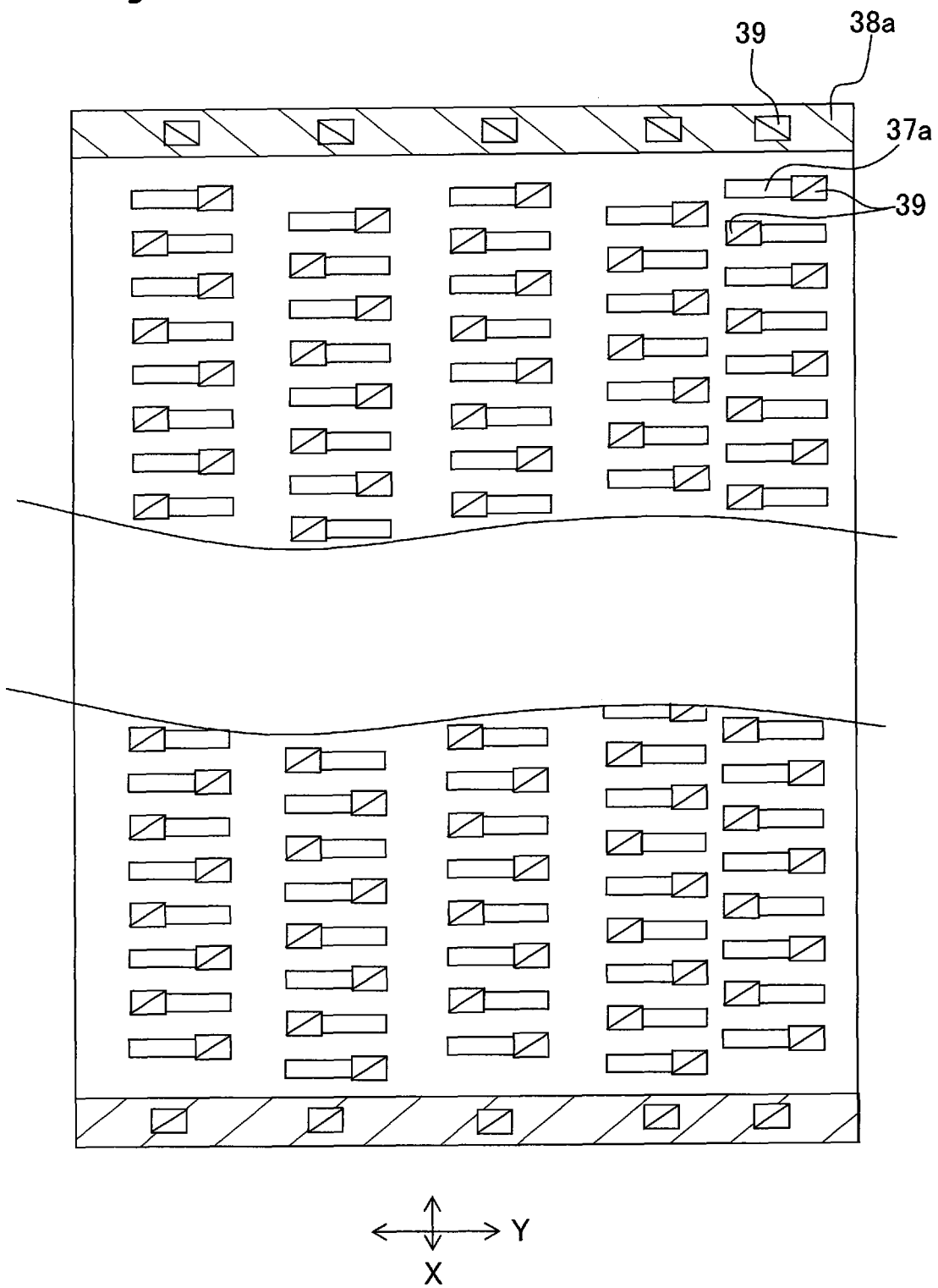
FIG. 5 is a plan view of an actuator.

The electrodes include individual electrodes 37 which is formed corresponding to the pressure chambers 35, and common electrodes 38 each of which is formed spreading over the plurality of pressure chambers 35. The individual electrodes 37 and the common electrodes 38 are arranged alternately between the ceramics layers 36. A plurality of surface individual electrodes 37a and surface common electrodes 38a are formed on an uppermost surface of the actuator 32 as shown in FIG. 5. The surface individual electrodes 37a and the surface common electrodes 38a correspond to the plurality of individual electrodes 37 and common electrodes 38. The surface individual electrodes 37a (the surface common electrodes 38a) are electrically connected to the corresponding individual electrodes 37 (common electrodes 38) via through holes.

The surface individual electrodes 37a and the surface common electrodes 38a are formed of an Ag—Pd metallic material. Each of the surface individual electrodes 37a has an elongated shape corresponding to a shape of the pressure chambers 35 and the individual electrodes 37, and the surface individual electrodes correspond to pressure chambers 35 (nozzles 7). Similarly as the individual electrodes 37 and the pressure chambers 35, the surface individual electrodes 37a form a row in the X direction, and these electrode rows are arranged in the Y direction for each color. Moreover, the surface common electrodes 38a are provided in the form of a strip and are arranged on both end portions in the X direction of the actuator 32. Each of the surface individual electrodes 37a and the surface common electrodes 38a has a connecting terminal 39 connecting to the flexible wiring 4. As it will be described later, each of the connecting terminals 39 is connected to an output electrode 44 of the flexible wiring 4, via an electroconductive brazing filler material such as solder. The connecting terminal 39 on the surface individual electrode 37a is formed alternately at both end portions in the Y direction of each surface individual electrode 37a. In other words, as shown in FIG. 5, the connecting terminals 39 are arranged in a row in a zigzag (staggered) form in the X direction.

In the actuator 32 provided with the electrodes in such manner, a drive voltage from the circuit element 50 which will be described later is selectively applied between one of the individual electrodes 37 and one of the common electrodes 38, via the flexible wiring 4. A portion of the ceramics layer 36 sandwiched between the individual electrode 37 and the common electrode 38 serves as a drive portion (active portion) and is deformed by applying the drive voltage. With the deformation of the drive portion, a pressure is applied to the ink inside the pressure chamber 35, and the ink is jetted from the nozzle 7.

Next, the flexible wiring 4 (the first wire member 41 and the second wire member 42) of the first embodiment will be described below.

The first wire member 41 and the second wire member 42 have a substrate 55 in the form of a strip made of a material such as polyimide having a flexibility and an electrically insulating property, a plurality of electroconductive wires 56 formed on one surface of the substrate 55, and a covering material 57 made of solder resist which covers and insulates the electroconductive wires 56. The substrate 55, the electroconductive wires 56, and the covering material 57 are stacked (stacked structure). The auxiliary wire 51, similarly, has a substrate, electroconductive wires, and a covering material, and the substrate, the electroconductive wires, and the covering material are stacked. Moreover, each of the first wire member 41 and the second wire member 42 has the circuit element 50 which drives the actuator 32 mounted thereon (refer to FIG. 3). An input electroconductive wire 56a connected from the auxiliary wire 51 is connected to an output electroconductive wire 56b for connecting to the actuator 32, via the circuit element 50. The output electrodes 44 (44a and 44b) to be connected to the connecting terminal 39 of the actuator 32 are formed by exposing partially the output electroconductive electrodes 56b. The circuit element 50 converts a driving signal transmitted in series from the circuit board 23, to a parallel signal corresponding to the plurality of individual electrodes 37, and is output to the actuator 32 through the output electrodes 44 of the first wire member 41 and the second wire member 42, as a voltage signal suitable for driving of the ceramics layer 36.

Figure 6A:
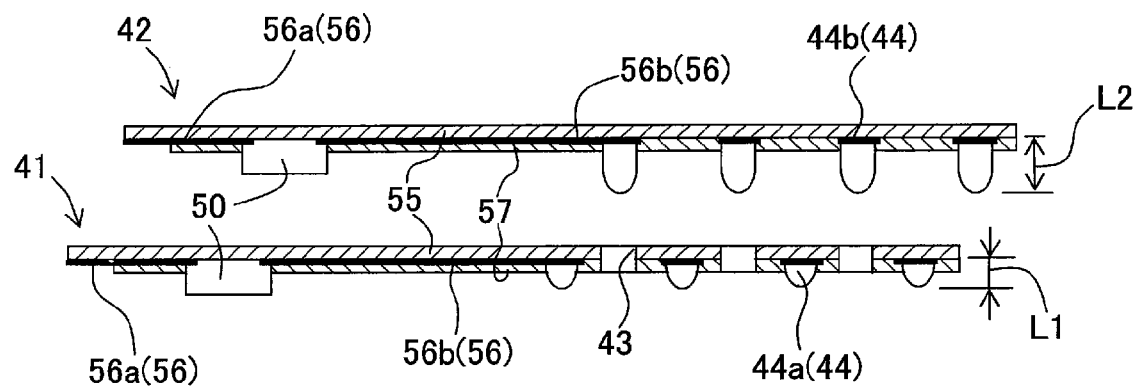
FIG. 6A is a vertical cross-sectional view before a first wire member and a second wire member in the first embodiment are overlapped.
Figure 6B:
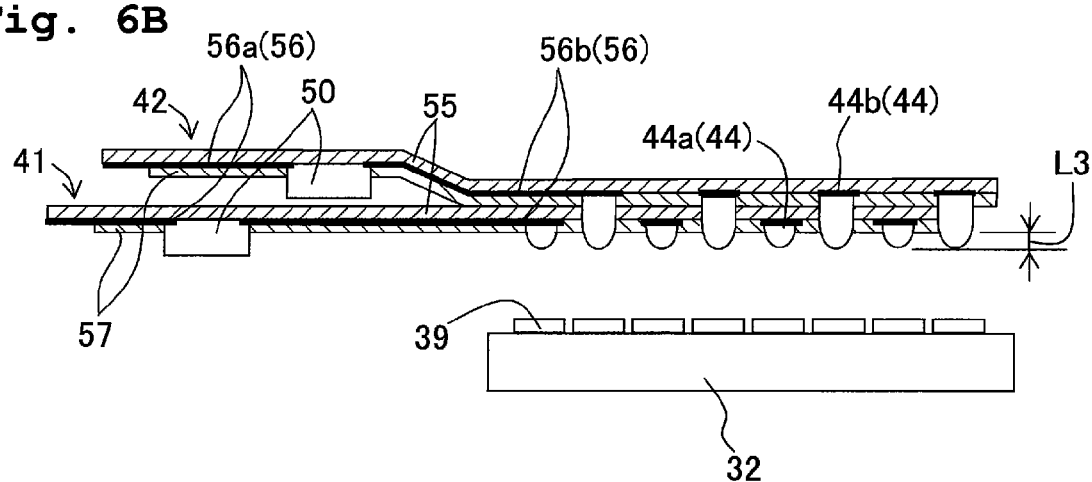
FIG. 6B is a vertical cross-sectional view of the first wire member and the second wire member in an overlapped state.

In the first embodiment, as shown in FIG. 6, both the first wire member 41 and the second wire member 42, are stacked with the covering material 57 directed toward the actuator 32. A portion of the electroconductive wires 56 is exposed toward the actuator 32 by partially removing the covering material 57. Bumps 44a and 44b are formed at sites (portions) at which the electroconductive wire 56 is exposed. The circuit element 50 is also connected electrically to an electroconductive wire (electrode) in which the covering material 57 is partially removed to expose the wires toward the actuator 32.

As shown in FIGS. 3, 5, and 6, the first wire member 41 and the second wire member 42 are stacked such that the second wire member 42 is overlapped on an upper surface of the first wire member 41. One end of each of the first wire member 41 and the second wire member 42 is joined (connected) to the actuator 32, and the other end thereof is drawn in the same direction from the actuator 32. The first wire member 41 and the second wire member 42 are drawn to be inserted to the slit hole 25 formed in the bottom plate 21 of the head holder 20, the first and second wiring members being drawn in a direction from a lower surface to an upper surface of the bottom plate 21, and are further drawn in parallel to the upper surface of the bottom plate 21 toward the side wall 20a, and are drawn to extend upward along the side wall 20a. The circuit element 50 described above is mounted on a lower surface of an area parallel to the bottom plate 21, of the first wire member 41 and the second wire member 42.

Figure 7A:
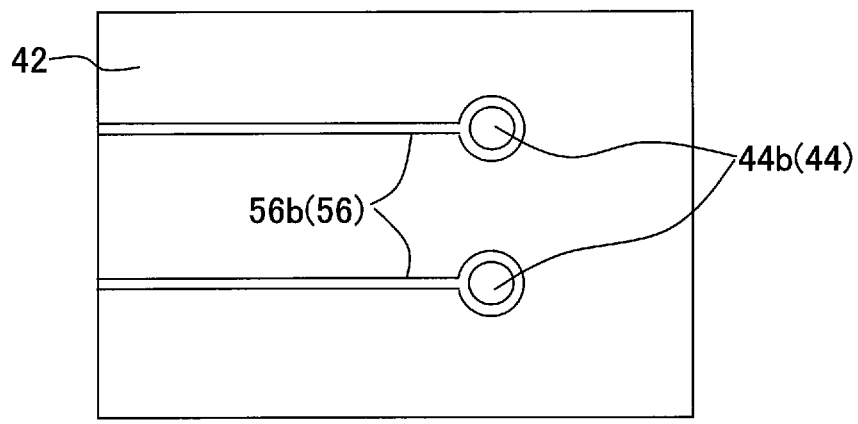
FIG. 7A is a schematic bottom view of the second wire member.
Figure 7B:
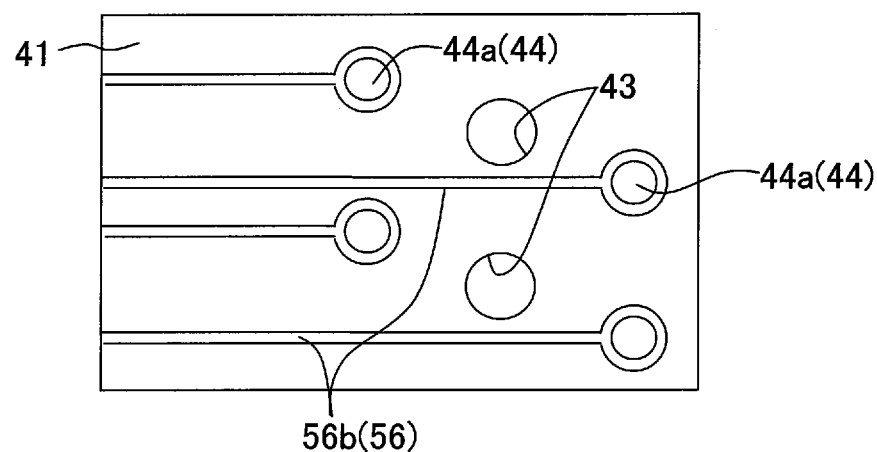
FIG. 7B is a schematic bottom view of the first wire member.
Figure 7C:
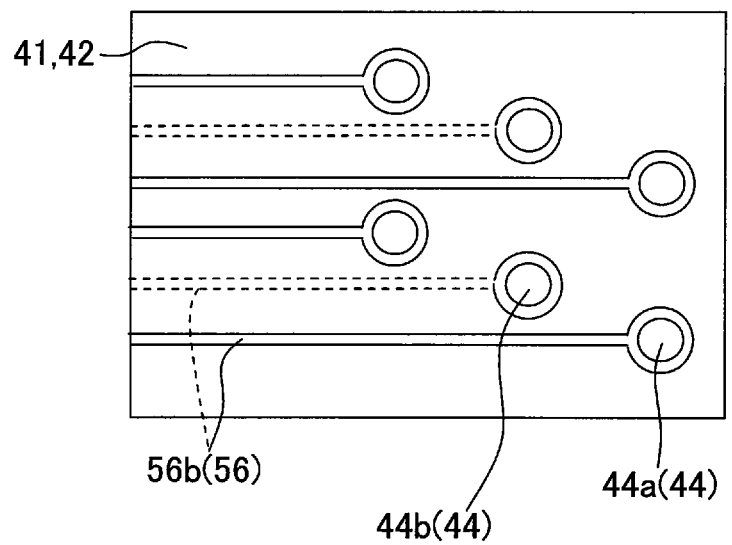
FIG. 7C is a schematic bottom view of the first wire member and the second wire member in an overlapped state.

Both the output electrodes 44 of the first wire member 41 and the second wire member 42 of the flexible wiring 4 correspond to the plurality of connecting terminals 39 of the actuator 32, and are formed at positions overlapping with the connecting terminals 39 in a plan view. As shown in FIG. 6 and FIG. 7, the output electrodes 44 are formed to be distributed for each of the first wire member 41 and the second wire member 42, and each of the output electrodes 44 is provided with a bump in the form of a protrusion (projection) made of an electroconductive brazing filler material (solder) for connecting to the connecting terminal 39.

As shown in FIGS. 6 and 7, first bumps 44a of the output electrodes 44 of the first wire member 41 arranged on a lower side of the flexible wiring 4 are arranged to face the connecting terminals 39 of the actuator 32, and first bumps 44a are directly connected to a part of the connecting terminals 39. Second bumps 44b of the output electrodes 44 of the second wire member 42 overlapping on the first wire member 41, are connected to the remaining connecting terminals 39 of the actuator 32, via through holes 43 which are formed in the first wire member 41. In this manner, a part of the connecting terminals 39 are connected to the first bumps 44a of the first wire member 41, and the remaining connecting terminals 39 are connected to the second bumps 44b of the second wire member 42. Here, the connecting terminals 39 connected to the first bumps 44a and the connecting terminals 39 connected to the second bump 44bs are arranged to be distributed mutually in a plan view.

The through holes 43 of the first wire member 41 are in areas not overlapping with the first bumps 44a and the electroconductive wires 56, and in areas in which the covering material 57 is stacked directly on the substrate 55, at positions facing the second bumps 44b of the second wire member 42. The through holes 43 are holes each of which is drilled continuously through the substrate 55 and the covering material 57, and is formed by a machining such as punching. A process for forming such through holes 43 is easier and needs less cost as compared to a process of partially removing the covering material 57 for forming the output electrode 44 as described above.

As shown in FIG. 6, a height L2 of the second bumps 44b of the second wire member 42 is more than a height L1 of the first bumps 44a of the first wire member 41. Here, the height L2 of the second bumps 44b is adjusted such that, each of the second bumps 44b protrudes from one of the through holes 43 of the first wire member 41 when the second wire member 42 is overlapped on the first wire member 41. The height is adjusted such that, when an amount of projection of the first bumps 44a each of which is projected (protruded) from the surface of the first wire member 41 toward the actuator 32 is let to be L3, an amount of projection of the second bumps 44b projected (protruded) from the surface through the through holes 43 is also L3. In other words, an adjustment is made such that, the amount of projection of the first bumps 44a and the second bumps 44b from the surface toward the actuator 32 in the first wire member 41 becomes the same. Therefore, a front end of the first bumps 44a and a front end of the second bumps 44b are in the same plane. In this case, at the time of electrically connecting the output electrodes 44 to the surface electrodes 39 of the actuator 32, it is possible to make an amount of the brazing filler material between the connecting terminals 39 and the output electrodes 44 to be almost the same, and to make uniform a pressure to be exerted at the time of joining. Therefore it is possible to suppress variation (unevenness) in connections, and to reduce an occurrence of a connection defect.

In this manner, the first bumps 44a and the second bumps 44b to be connected to the actuator 32 are provided separately for the first wire member 41 and the second wire member 42. Therefore, even when a wiring pitch of each of the single wire members, namely the first wire member 41 and the second wire member 42, is rough, it is possible to make highly dense the wiring pitch as a whole by stacking the first and second wire members 41, 42 (refer to FIG. 7). As it has been described above, making the wiring pitch highly dense by forming wires on both surfaces of a single wire member may be taken into consideration. However, according to verifications (tests) of inventors of the present invention, in the flexible wiring 4 of the first embodiment, it is possible to realize a highly dense wiring pitch (highly dense wiring) than in a case of double-sided wiring of the single wire member. Even in the case of the double-sided wiring, all the electrodes are to be formed on one side. Therefore, through holes, which expose the wires formed on the other surface, are to be formed, avoiding positions of the wires and the electrodes on the one surface. In this case, there are limitations in carrying out such machining on one wire member. On the other hand, as in the flexible wiring 4 of the first embodiment, by arranging a plurality of wire members with single-sided wiring and combining these wire members, it is possible to realize the highly dense wiring. In FIG. 7, an embodiment, in which a wiring pattern of the first wire member 41 and a wiring pattern of the second wire member 42 do not overlap, is shown. However, unless positions of the first bumps 44a do not overlap with those of the second bumps 44b, a portion excluding an area near the output electrode 44 in the electroconductive wire 56 may overlap in a vertical direction.

Figure 8:
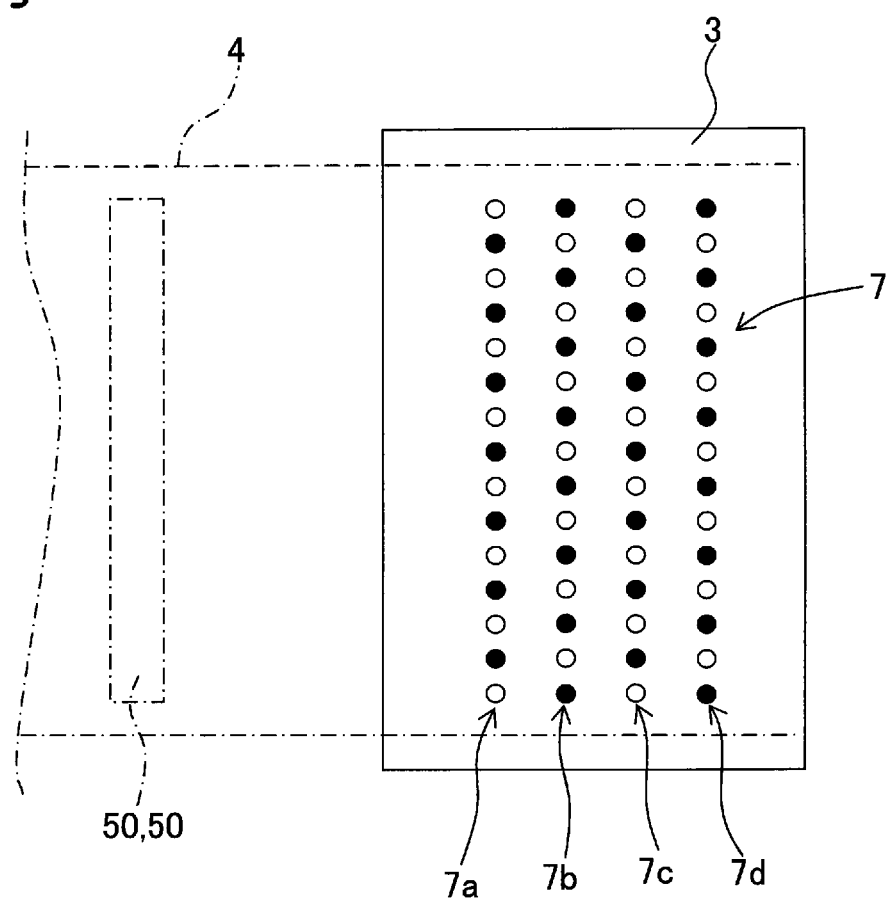
FIG. 8 is a schematic bottom view of a nozzle surface.

In the recording apparatus 1 of this embodiment (the first embodiment), the nozzles 7 are arranged in four nozzle rows 7a, 7b, 7c, and 7d (hereinafter, nozzle rows 7a to 7d) (nozzle groups). Here, the nozzle rows 7a, 7b, 7c, and 7d jet the black ink, the cyan ink, the magenta ink, and the yellow ink respectively. The drive portions of the actuator 32 are provided corresponding to the nozzles 7, respectively. In other words, there is n number of drive portions corresponding to the n number of nozzles 7 in each of the nozzle rows. Moreover, a driving signal through the circuit element 50 of the first wire member 41 is input to a part of the n number of drive portions, and a driving signal through the circuit element 50 of the second wire member 42 is input to the remaining drive portions. For description, in FIG. 8, the nozzles 7 through which the ink is jetted by the driving signal via the circuit element 50 of the first wire member 41 are shown by white circles, and the nozzles 7 through which the ink is jetted by the driving signal via the circuit element 50 of the second wire member 42 are shown by black circles. FIG. 8 is merely an example of an arrangement of nozzles, and the white circles and the black circles are not necessarily required to be arranged alternately.

In the recording apparatus 1 of the first embodiment, two circuit elements 50 are used, and there is a variation in characteristics of the two circuit elements 50. When the driving signal via one of the circuit elements 50 is let to correspond to nozzle rows 7a and 7b, and the driving signal via the other of the circuit elements 50 is let to correspond to nozzle rows 7c and 7d, the variation in characteristics of the two circuit elements leads to a variation in jetting characteristics of the nozzle rows 7a and 7b, and jetting characteristics of the nozzle rows 7c and 7d. Therefore, as it has already been mentioned earlier, by distributing a signal via one of the circuit elements 50 to a plurality of nozzle rows, it is possible to reduce substantially an effect of the variation in characteristics of the circuit elements.

Figure 9:
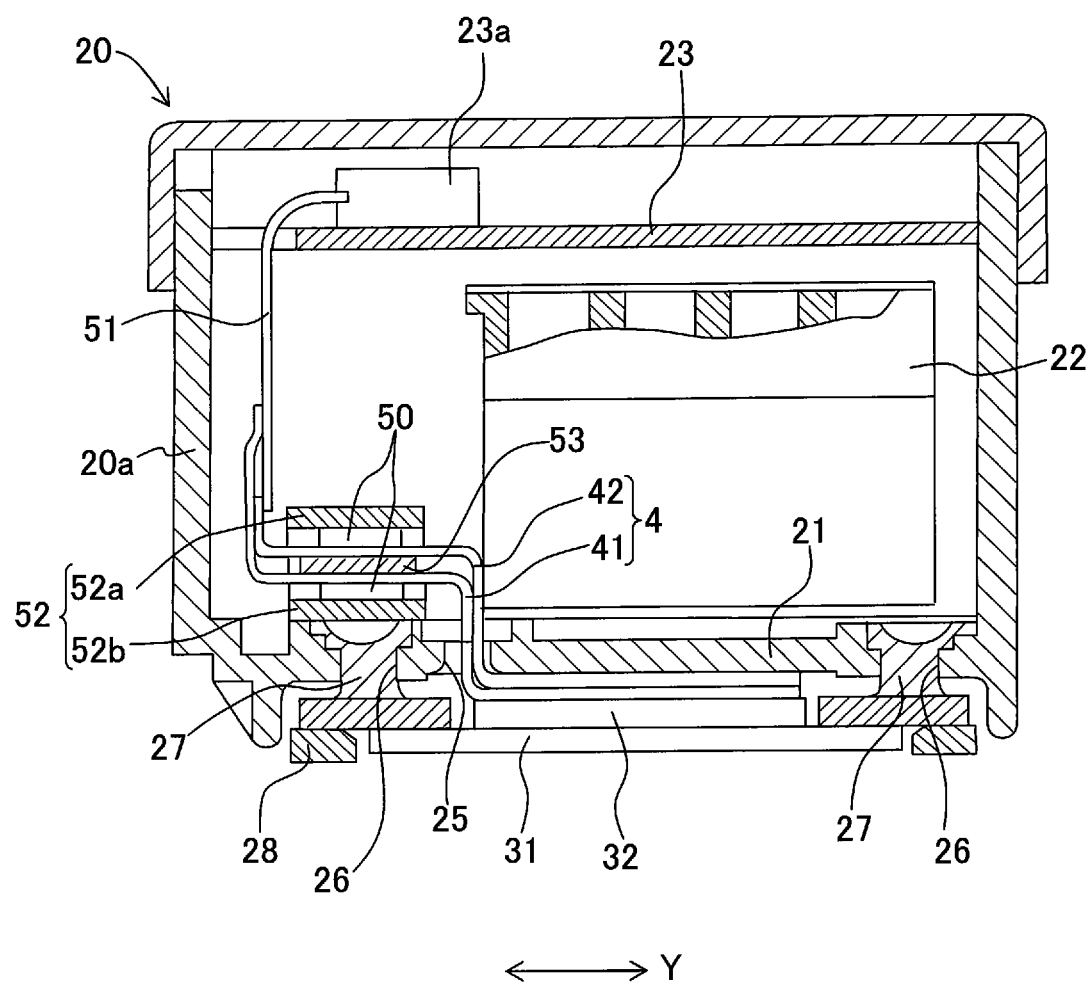
FIG. 9 is a vertical cross-sectional view in which, a head holder in a second embodiment is cut in the Y direction.
Figure 10A:
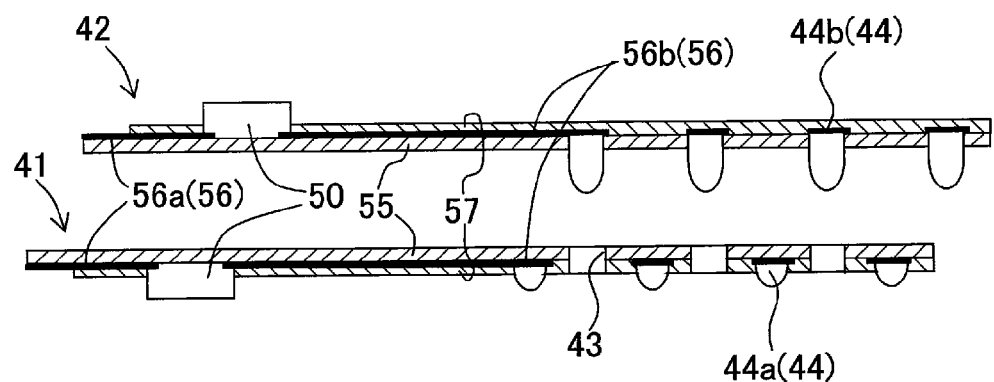
FIG. 10A is a vertical cross-sectional view before a first wire member and a second wire member in the second embodiment are overlapped.
Figure 10B:
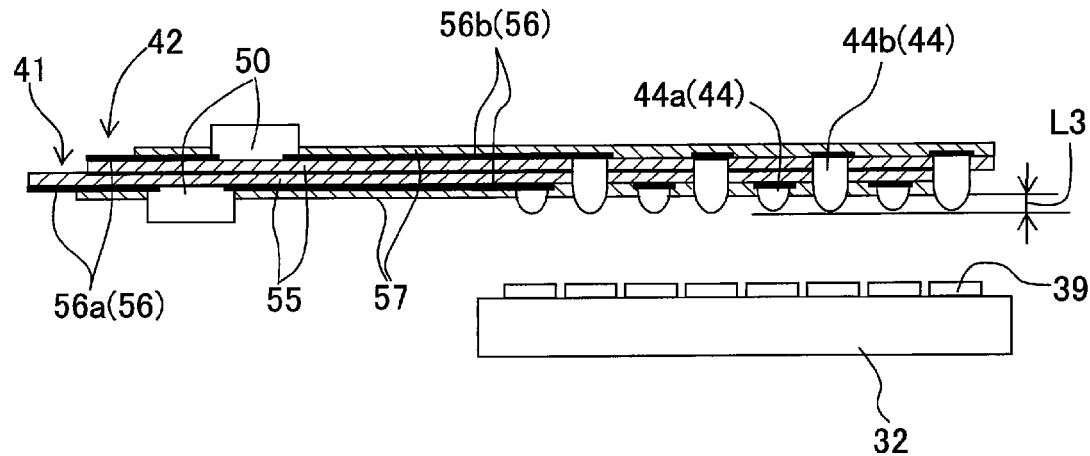
FIG. 10B is a vertical cross-sectional view of the first wire member and the second wire member in an overlapped state.

Next, the flexible wiring 4 of a second embodiment will be described with reference to FIGS. 9 and 10. Same reference numerals are used for components having the same structure as in the first embodiment, and description of such components is omitted. In the second embodiment, as shown in FIG. 10, the second wire member 42 is arranged such that the substrate 55 is facing the first wire member 41, and the output electrodes 44 are formed by providing the second bumps 44b at positions of the electroconductive wires 56 which are exposed by the substrate 55 being removed partially. Similarly as in the first embodiment, the second bumps 44b are protruded toward the actuator 32, via the through holes 43 penetrated in the first wire member 41.

Since each of the circuit elements 50 is mounted on the covering material 57 of the first wire member 41 and the second wire member 42, the circuit elements 50 are mounted on surface not facing mutually, of the first wire member 41 and the second wire member 42. The heat releasing body (heat sink) 52 having a U-shape is arranged on the upper surface of the bottom plate 21, and as shown in FIG. 9, an upper surface of the circuit element 50 of the first wire member 41 is in a close contact with a lower surface of the upper plate portion 52a of the heat releasing body 52, and a lower surface of the circuit element 50 of the second wire member 42 is in a close contact with an upper surface of the lower plate portion 52b of the heat releasing body 52. The elastic member 53 made of rubber is inserted to be compressed between the upper surface of the first wire member 41 and the lower surface of the second wire member 42, at a position overlapping with the circuit element 50. Each circuit element 50 makes a close contact with the heat releasing body 52 due to an elastic force (restoration force) of the elastic member 53.

Unless it is possible to project the first bumps 44a of the first wire member 41 directly toward the actuator 32, and to project the second bumps of the second wire member 42 toward the actuator 32 via the through holes 43 in the first wire member 41, any of a front surface and a rear surface of the first wire member 41 may be overlapped with the second wire member 42, and appropriate modifications which fairly fall within the basic teachings are possible without restricting to the first embodiment and the second embodiment.

In the embodiments described above, the flexible wire has two wire members each having wirings on one side (one surface) thereof. Therefore, as it has been described above, it is possible to realize highly dense wiring as compared to a case of using one wire member with a double-sided wiring. Moreover, at the time of forming through holes in one of the wire members, at positions corresponding to the electrodes provided on the other of the wire members, even when there is some position shift, it is possible to form the holes once again, provided that the through holes do not coincide with wires formed on the one of the wire members. Whereas, when the wires are formed on both surfaces, it is necessary to position the wire members to form the through holes such that the wires on the one surface is exposed through the through holes to the other surface. Therefore, a control of positioning of the through holes becomes necessary, and a manufacturing of the wire members becomes difficult. Moreover, in the flexible wiring according to the present invention, it is possible to make flat a surface on which the bumps are not formed. For example, with the flat surface facing downward, at the time of arranging a device such as an IC chip etc. on a surface at the opposite side thereof, it is possible to position the device easily and assuredly without having an effect of unevenness due to the bumps etc.

In the embodiments described above, the flexible wiring 4 has been formed by two wire members. However, the flexible wiring 4 may be formed by three or more wire members. Moreover, a plurality of wire members is not necessarily required to be drawn from the actuator 32 in a same direction, and may be drawn in different directions.

Figure 11:
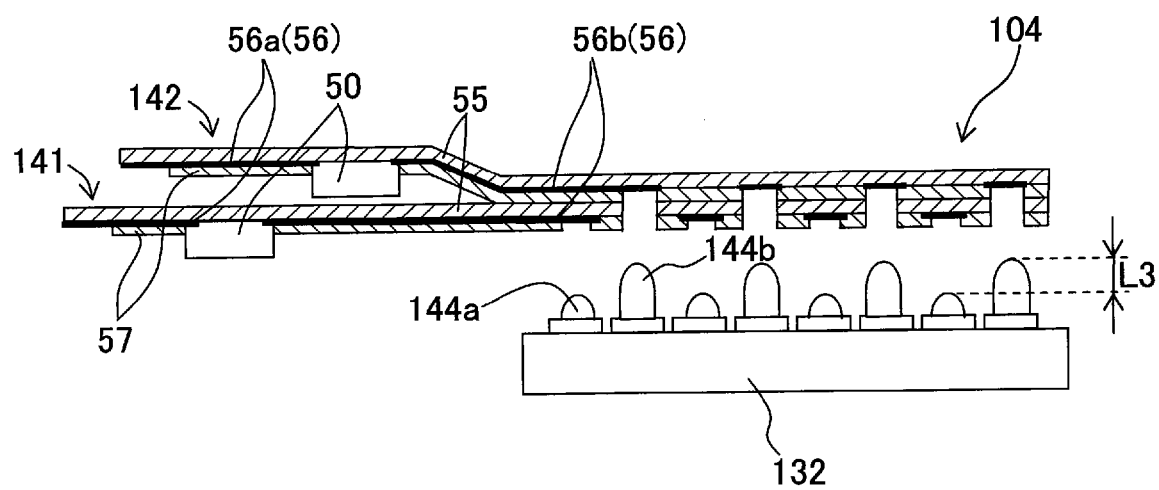
FIG. 11 is a diagram showing an example in which bumps of different heights are formed on (in) the actuator.
Figure 12:
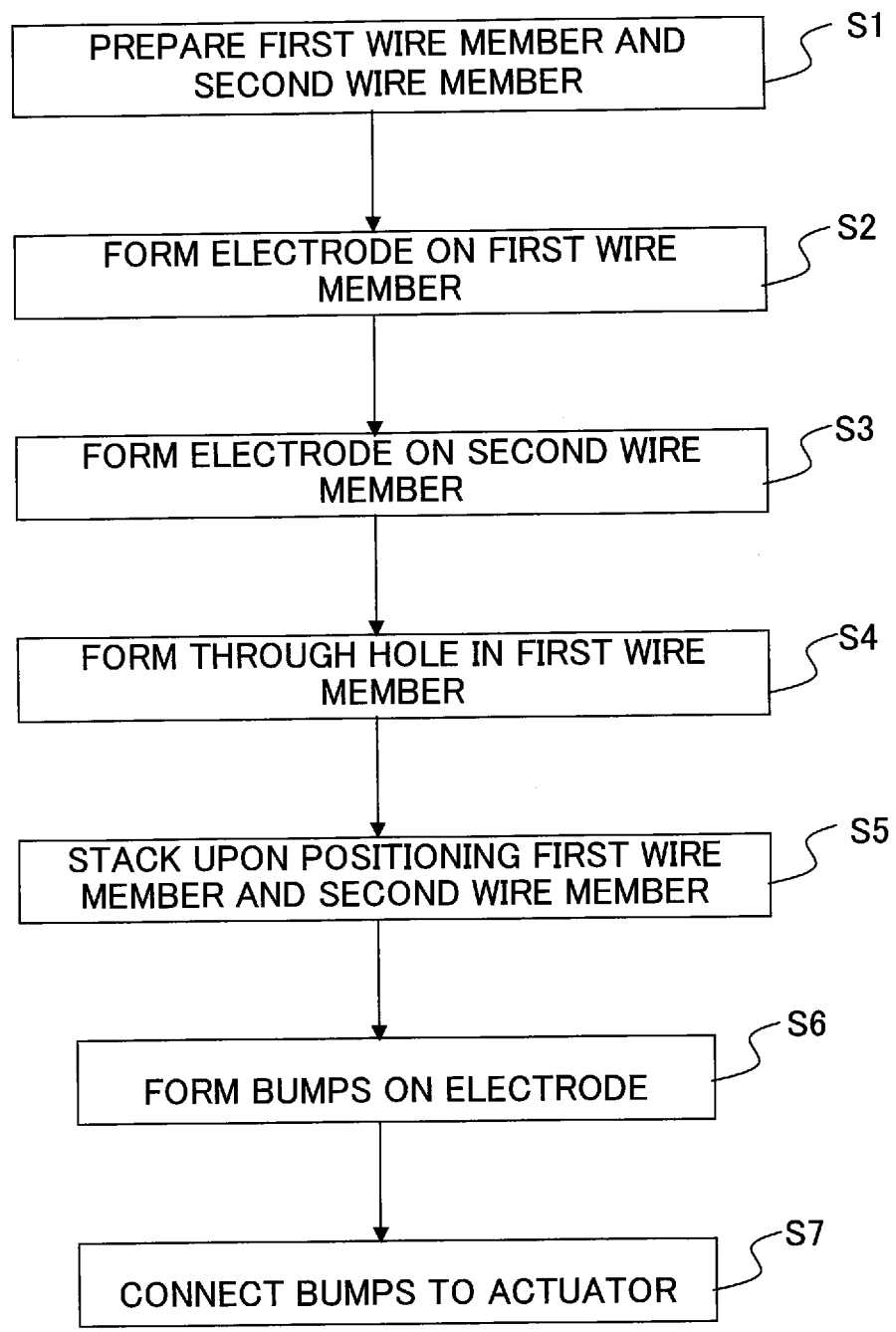
FIG. 12 is a flowchart showing a method of connecting the flexible wiring and the device according to the present invention.
Figure 13A:
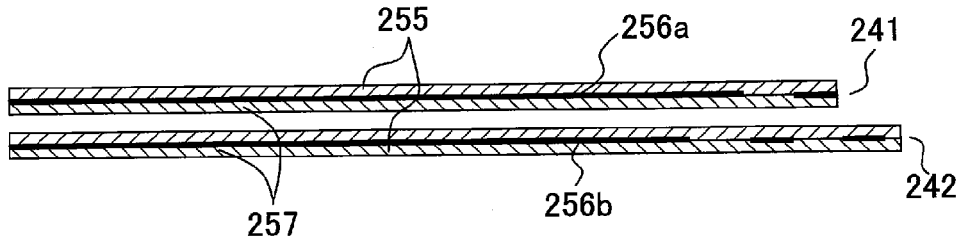
FIG. 13A to FIG. 13G are diagrams showing a process from steps S1 to S7 in FIG. 12.
Figure 13B:
Figure 13C:
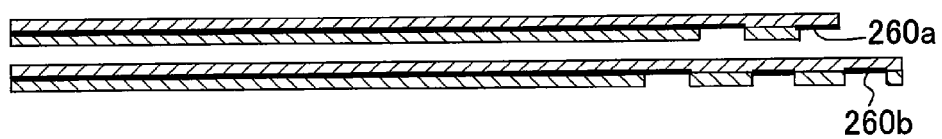
Figure 13D:
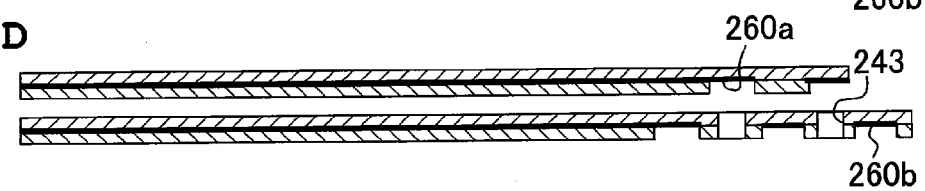
Figure 13E:
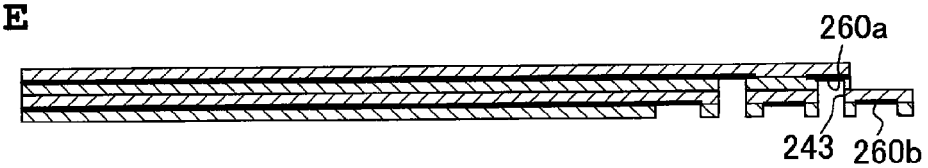
Figure 13F:
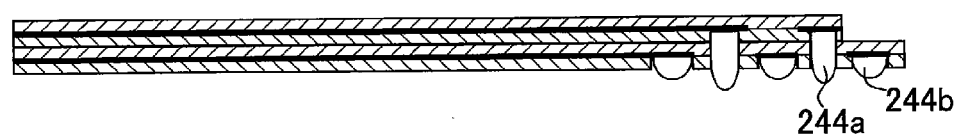
Figure 13G:
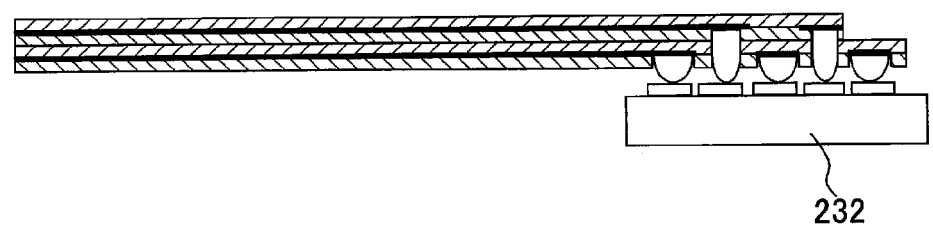

Furthermore, the flexible wiring 4 of the present invention may be connected not only to the actuator 32 of the liquid droplet jetting apparatus, but also to other device. It is particularly suitable in a case where a particularly highly dense wiring is necessary. For example, any arbitrary device (electronic circuit) including various sensor devices such as an IC chip and a CCD may be connected as a device. As it is shown in FIG. 11, it is possible to form bumps of different heights on a side of a device such as an actuator 132. In the embodiments described above, the bumps 44a and 44b having different height have been formed on each of the wire members of the flexible wiring 4. However, in an example shown in FIG. 11, bumps 144a and 144b of different height are formed on terminals of the actuator 132, and the actuator 132 is connected to a flexible wire 104 by the bumps 144a and 144b. The flexible wire 104 has two wire members 141 and 142, and has a structure same as the flexible wiring 4 described above except that it does not have bumps. A difference in the height of the bumps 144a and the height of the bumps 144b is about the same as a thickness of the wire member 141, and similarly as in the embodiments described above, it is possible to join the flexible wire and the actuator assuredly. Such a device having the bumps of different heights is not restricted to an actuator of a liquid droplet jetting apparatus, and may be any arbitrary device (electronic circuit) including various sensor devices such as an IC chip and a CCD for example.

Next, a method of connecting an actuator and a device by using a flexible wiring as described above will be described below with reference to a flowchart shown in FIGS. 12, and 13A to 13G. Firstly, two wire members 241 and 242 each having wires formed on one surface are arranged (step S1, FIG. 13A). The wire member 241 (242), similarly as the wire member 41 (42) of the embodiments described above, has a substrate 255, electroconductive wires 256a (256b) arranged on one surface of the substrate 255, and a covering material 257 which covers the electroconductive wires 256a (256b). The electroconductive wires 256a are exposed by removing a portion (a part) of the covering material 257 of the wire member 241, and electrodes 260a are formed (step S2, FIG. 13B). Similarly, the electroconductive wires 256b are exposed by removing a portion of the covering material 257, and electrodes 260b are formed (step S3, FIG. 13C). Next, when the wire member 241 and the wire member 242 are positioned, through holes 243 are formed in the wire member 241, at positions overlapping with the electrodes 260b (step S4, FIG. 13D). Further, the wire members 241 and 242 are positioned and stacked such that the through holes 243 overlap with the electrodes 260b (step S5, FIG. 13E). Next, bumps 244a and 244b each having different height, are formed in the electrodes 260a and 260b respectively (step S6, FIG. 13F). Here, the bumps 244a and 244b are formed by an electroconductive brazing filler material. A difference between the height of the bumps 244b and the height of the bumps 244a is adjusted to be about the same as a thickness of the wire member 241. In other words, an adjustment is carried out such that, front ends of the bumps 244a and 244b are at the same height. Finally, the bumps 244a and 244b are connected to terminals of the actuator 232 (step S7, FIG. 13G).

In this manner, it is possible to connect the flexible wire having the two wire members 241 and 242 to a device such as an actuator. In the abovementioned description, it is not necessary to carry out the process in an order of steps from S2 to S7, and the order of the process may be changed according to the requirement. For example, while the wire members 241 and 242 are positioned and stacked, the through holes 243 may be formed in the wire member 241, and the covering material 257 of the wire member 242 may be removed. In this case, it is possible to form the through holes 243 and to form the electrodes 260b exposed through the through holes 243 simultaneously. Moreover, the electrodes 260a and 260b may be formed on the wire members 241 and 242, and further, with the bumps 244a and 244b having different lengths formed on the electrodes 260a and 260b, the wire members 241 and 242 may be positioned and stacked.

The bumps 244a and 244b may not be necessarily formed on the wire members 241a and 241b, and as it has been described above, two type of bumps having different height may be formed on terminals of the actuator 232, and the two stacked wire members 241 and 242 and the actuator 232 may be connected by the bumps. Moreover, the electrodes 260a and 260b may be formed by removing portions of the substrate 255. Moreover, the device to be connected to the wire members is not restricted to be an actuator, and any arbitrary device may be used.

What is claimed is:

1. A liquid droplet jetting head which jets droplets of different types of liquids, comprising:
    a flexible wiring member which is arranged to face a device, and which connects the device and an external signal source, the flexible wiring member comprising:
        two wire members which are stacked mutually, and each of which have a belt-shaped substrate, a plurality of wires formed on one surface of the substrate, a plurality of electrodes connected to the wires respectively, and a plurality of bumps each projected from one of the electrodes toward the device,
        wherein a plurality of through holes is formed in one of the wire members stacked on a side of the device, and the bumps of the other of the wire members face the device through the through holes formed in the one of the wire members,
    wherein the one of the wire members comprises a facing surface facing the device and exposed to an exterior of the flexible wiring member,
    wherein the bumps of the other of the wire members facing the device via the one of the wire members are formed to be projected, from the facing surface of the one of the wire members facing the device through the through holes formed in the one of the wire members; and
    a height of the bumps of each of the two wire members is adjusted such that a projection amount of a portion of the bumps projected through the through holes projecting from the facing surface of the one of the wire members is the same as a projection amount, of a portion of the bumps provided on the one of the wire members projecting from the facing surface of the one of the wire members;
a cavity section which is filled with the liquid, and in which a plurality of nozzle groups corresponding to the types of the liquids respectively are formed, each of the nozzle groups having a plurality of nozzles; and
an actuator serving as the device and including a plurality of driving sections which correspond to the nozzles respectively and which apply selectively a jetting pressure to the liquids, respectively, in the cavity section,
wherein a circuit element is mounted on the substrate of each of the wire members of the flexible wiring member, and a signal from the external signal source is divided into a plurality of driving signals each traveling through one of the wire members and each of the driving signals is inputted to the driving sections via one of the circuit elements; and
a part of the driving signals traveled through the circuit element of each of the two wire members is distributed and inputted to a part, of the driving sections, corresponding to the nozzles in different nozzle groups.

* * * * *